US007741681B2

(12) United States Patent
Chapman et al.

(10) Patent No.: US 7,741,681 B2
(45) Date of Patent: Jun. 22, 2010

(54) LATCHUP ROBUST ARRAY I/O USING THROUGH WAFER VIA

(75) Inventors: Phillip Francis Chapman, Colchester, VT (US); David S. Collins, Williston, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 243 days.

(21) Appl. No.: 11/956,386

(22) Filed: Dec. 14, 2007

(65) Prior Publication Data

US 2009/0152632 A1 Jun. 18, 2009

(51) Int. Cl.
*H01L 23/62* (2006.01)
(52) U.S. Cl. ............... 257/372; 257/357; 257/E27.063; 438/237

(58) Field of Classification Search .................. 257/276, 257/355–357, 372, E27.063; 438/237, 620
See application file for complete search history.

(56) References Cited

U.S. PATENT DOCUMENTS 7,498,622 B1 * 3/2009 Chapman et al. ............ 257/276

* cited by examiner

*Primary Examiner*—Matthew C Landau
*Assistant Examiner*—Daren Wolverton
(74) *Attorney, Agent, or Firm*—Schmeiser, Olsen & Watts; W. Riyon Harding

(57) ABSTRACT

A structure and a method for preventing latchup. The structure including: an I/O cell and an ESD protection circuit in a region of an integrated circuit chip containing logic circuits; an electrically conductive through via extending from a bottom surface of the substrate toward a top surface of the substrate between the I/O cell and an ESD protection circuit and at least one of the logic circuits.

18 Claims, 3 Drawing Sheets

US 7,741,681 B2

LATCHUP ROBUST ARRAY I/O USING THROUGH WAFER VIA

FIELD OF THE INVENTION

The present invention relates to the field of Integrated circuits; more specifically, it relates to an array I/O structure and method of making array I/O latchup robust.

BACKGROUND OF THE INVENTION

In modern integrated circuits, input/output (I/O) circuits are placed within a region of the integrated circuit chip containing logic circuits. By placing I/O circuits in such close proximity to logic circuits, complementary metal-oxide-silicon (CMOS) field effect transistors (FETs) in the circuits have been found to be susceptible to latch-up. Latch-up causes FETs to consume large amounts of current overheating and destroying the integrated circuit in which latchup occurs. Existing methods for reducing this propensity to latchup have become increasingly less effective as doping levels of the substrates of integrated circuits have decreased. Therefore there is a need in the industry for more robust latchup preventive structures and methods for preventing latchup for integrated circuits having I/Os embedded in the logic circuit regions of integrated circuit chips.

SUMMARY OF THE INVENTION

A first aspect of the present invention is a structure, comprising: one or more logic circuits positioned in a region of a semiconductor substrate, the substrate having a top surface and a bottom surface, the one or logic circuits comprising first FETs having first well regions in the substrate, the first well regions extending from the top surface of the substrate into the substrate a first distance, the first distance less than whole distance between the top and bottom surfaces of the substrate; an I/O cell and an ESD protection device in the region of the substrate, the I/O cell comprising second FETs having second well regions in the substrate and the ESD protection device comprising third FETs having third well regions in the substrate, the second well regions extending from the top surface of the substrate into the substrate a second distance, the third well regions extending from the top surface of the substrate into the substrate a third distance, the second and third distances less than the whole distance; shallow trench isolation between the first, second and third FETs, the shallow trench isolation having a top surface coplanar with the top surface of the substrate and a opposite bottom surface in the substrate, the shallow trench isolation extending from the top surface of the substrate into the substrate a fourth distance, the fourth distance less than the whole distance; and an electrically conductive through via extending from the bottom surface of the substrate into the substrate a fifth distance, the fifth distance less than the whole distance, the through via abutting the bottom surface of shallow trench isolation between the ESD protection device and the I/O cell and at least one of the one or more logic circuits and intervening between the ESD protection device and the I/O cell and at least one of the one or more logic circuits.

A second aspect of the present invention is a method, comprising: forming one or more logic circuits positioned in a region of a semiconductor substrate, the substrate having a top surface and a bottom surface, the one or logic circuits comprising first FETs having first well regions in the substrate, the first well regions extending from the top surface of the substrate into the substrate a first distance, the first distance less than a whole distance between the top and bottom surfaces of the substrate; forming an I/O cell and an ESD protection device in the region of the substrate, the I/O cell comprising second FETs having second well regions in the substrate and the ESD protection device comprising third FETs having third well regions in the substrate, the second well regions extending from the top surface of the substrate into the substrate a second distance, the third well regions extending from the top surface of the substrate into the substrate a third distance, the second and third distances less than the whole distance; forming shallow trench isolation between the first, second and third FETs, the shallow trench isolation having a top surface coplanar with the top surface of the substrate and a opposite bottom surface in the substrate, the shallow trench isolation extending from the top surface of the substrate into the substrate a fourth distance, the fourth distance less than the whole distance; and forming an electrically conductive through via extending from the bottom surface of the substrate into the substrate a fifth distance, the fifth distance less than the whole distance, the through via abutting the bottom surface of shallow trench isolation between the ESD protection device and the I/O cell and at least one of the one or more logic circuits and intervening between the ESD protection device and the I/O cell and at least one of the one or more logic circuits.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Latchup is defined as the triggering of a parasitic structure which then acts as a short circuit creating a low impedence path between the power supply rails and an electrical component.

Figure 1A:
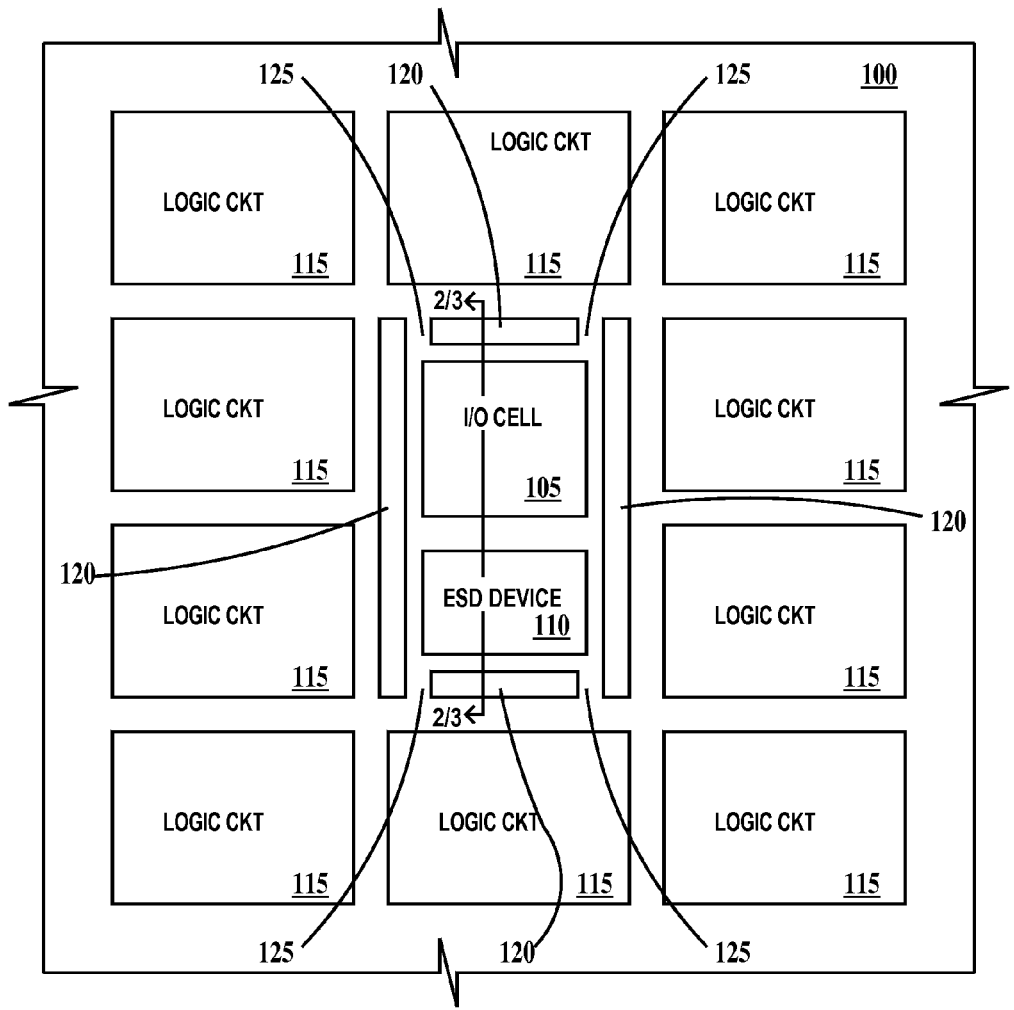
FIG. 1A is a top view of an integrated circuit according to embodiments of the present invention.

FIG. 1A is a top view of an integrated circuit according to embodiments of the present invention. In FIG. 1A, an integrated circuit chip 100 includes an I/O cell 105 and an ESD (electrostatic discharge) protection device 110 embedded in an array of logic circuits 115. I/O cell 105 and ESD protection device 110 are electrically connected. At least one of logic circuits 115 is electrically connected to I/O cell 105. Electrical connections between I/O cell 105, ESD protection device 110, and logic circuits 115 may be through wires formed in wiring levels formed above a semiconductor substrate containing the devices (e.g., FETs) that the I/O cell, ESD protection device and logic circuits are comprised of. Alternatively, electrical connections between I/O cell, ESD protection device 110 and logic circuits 115 may be though electrical paths in substrate 100. Logic circuits 115 need not be all the same function or the same size. I/O cell 105 provides signal I/O to one or more of logic circuits 115 and ESD protection device 110 provides attenuation ESD events before ESD induced damage can occur to either I/O cell 105 or logic circuit(s) 115. Surrounding a perimeter of I/O cell 105 and ESD protection device 110 is a ring-shaped through via 120. In the Example of FIG. 1A, through via 120 is not continuous, but is broken up by gaps 125. Alternatively, through via 120 may be continuous without gaps. As will become more apparent infra, without gaps 125, the region of integrated circuit chip 100 containing I/O cell 105 and ESD protection device 110 would no longer be integrally attached to the rest of the integrated circuit chip substrate. The less the number and/or smaller the gaps, the better the latchup protection. The greater the number and/or larger the gaps, the stronger the integrated circuit chip is.

Figure 1B:
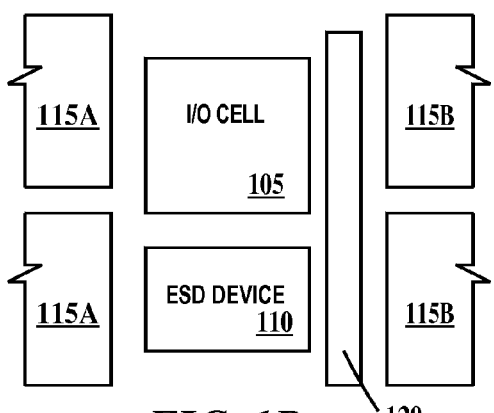
FIG. 1B is a top view of an integrated circuit according to embodiments of the present invention.

FIG. 1B is a top view of an integrated circuit according to embodiments of the present invention. Under certain circumstances, for example, when only some of adjacent logic circuits are susceptible to latch-up, the through via need only be positioned between the I/O cell and ESD protection device and those susceptible circuits. In one example, in FIG. 1B, logic circuits 115A are not susceptible to latchup and logic circuits 115B are susceptible to latchup so only logic circuits 115B need be protected from latchup. In one example, in FIG. 1B, logic circuits 115A are less susceptible to latchup and than logic circuits 115B so only logic circuits 115B need be protected from latchup. Alternatively, a through via between susceptible or more susceptible logic circuits and I/O cell and ESD protective device may have fewer (or no) and/or larger gaps while a through via between non-susceptible or less susceptible logic circuits and I/O cell and ESD protective device may have more and/or larger gaps.

Figure 1C:
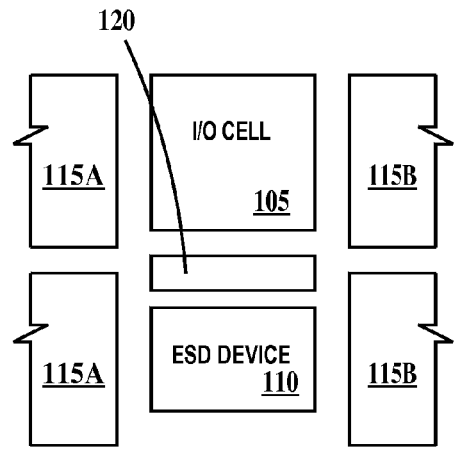
FIG. 1C is a top view of an integrated circuit according to embodiments of the present invention.

FIG. 1C is a top view of an integrated circuit according to embodiments of the present invention. Under certain circumstances it is I/O cell 105 and ESD Device 110 that are susceptible to latchup. In this case, a through via 120 is placed between I/O cell 105 and ESD protective device 110.

Figure 2:
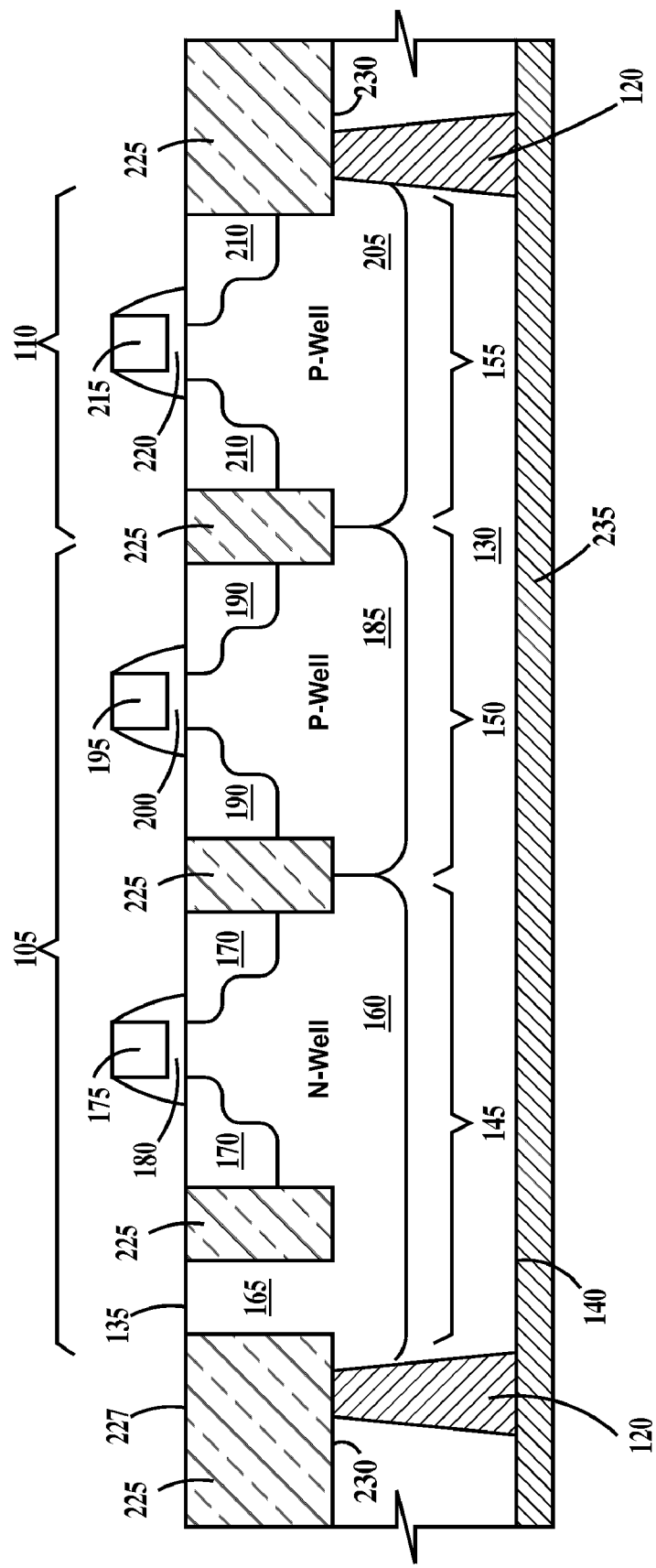
FIG. 2 is a cross-section through line 2/3-2/3 of FIG. 1 illustrating a first embodiment of the present invention.

FIG. 2 is a cross-section through line 2/3-2/3 of FIG. 1 illustrating a first embodiment of the present invention. In FIG. 2, a substrate 130 has a top surface 135 and a bottom surface 140. An exemplary I/O cell 105 includes a P-channel FET (PFET) 145 and an N-channel FET (NFET) 150 by way of example. There may be other FETs in I/O cell 105. An exemplary ESD protection device 110 includes an NFET 155 by way of example. Other examples of devices that may be used for ESD protection device 110 include PFETs, other Metal-Oxide-Silicon FETS (MOSFETS), bipolar transistors, resistors, diffused capacitors, N+ diffusions, and n-well to substrate diodes. There may be additional FETs in ESD protection device 155. In one example, ESD protection device 110 may include any device capable of injecting current into substrate 130. PFET 145 includes an N-Well 160 formed in substrate 130, an N-Well contact 165 and source/drains 170 formed in the N-Well. A gate electrode 175 is formed over a channel region of the N-Well between the source/drains with a gate dielectric 180 intervening between the gate electrode and the channel region. NFET 150 includes a P-Well 185 formed in substrate 130 and source/drains 190 formed in the P-Well. A gate electrode 195 is formed over a channel region of the P-Well between the source/drains with a gate dielectric 200 intervening between the gate electrode and the channel region. NFET 155 includes a P-Well 205 formed in substrate 130 and source/drains 210 formed in the P-Well. A gate electrode 215 is formed over a channel region of the P-Well between the source/drains with a gate dielectric 220 intervening between the gate electrode and the channel region. Shallow trench isolation (STI) 225 along with N-Well 160, and P-Wells 185 and 205 electrically isolates PFET 145, NFET 150 and NFET 155 from each other and other FETS such as those in logic circuits 115 (see FIG. 1A).

STI 225, N-well 160 and P-Wells 185 and 205 extend from top surface 135 of substrate 130 into the substrate, but do not extend to bottom surface 140 of the substrate. A top surface 227 of STI 225 is coplanar with top surface 135 of substrate 130. Through vias 120 extend from bottom surface 140 of substrate 130 into the substrate but to not extend to top surface 135. Through vias 120 abut a bottom surface 230 of STI 225. In FIG. 2, through vias 120 abut N-Well 160 and P-Well 205. Either an electrically conductive contact (which may be ohmic) or a Schottky diode is formed at the interface of through vias 120 and N-Well 160 and P-Well 205. An optional conductive layer 235 is formed on bottom surface 140 of substrate 130 to provide a low-resistance contact to through vias 120.

FETs of logic circuits 115 (see FIG. 1A) have similar structures as FET 145, 250 and/or 155, including P-Wells, N-Wells, source/drains, gate electrodes, gate dielectrics, and STI. Through vias 120 prevent latchup by preventing a parasitic connection between the P-Wells of FETs of logic circuits 115 (see FIG. 1) and P-Wells of FETS of I/O cell 105 and ESD protection device 110.

In one example, through vias 120 comprises doped polysilicon, tungsten, titanium, tantalum or combinations thereof. In one example, conductive layer 235 comprises doped polysilicon, tungsten, titanium, tantalum, aluminum, platinum, nickel, cobalt, a metal silicide or combinations thereof.

Figure 3:
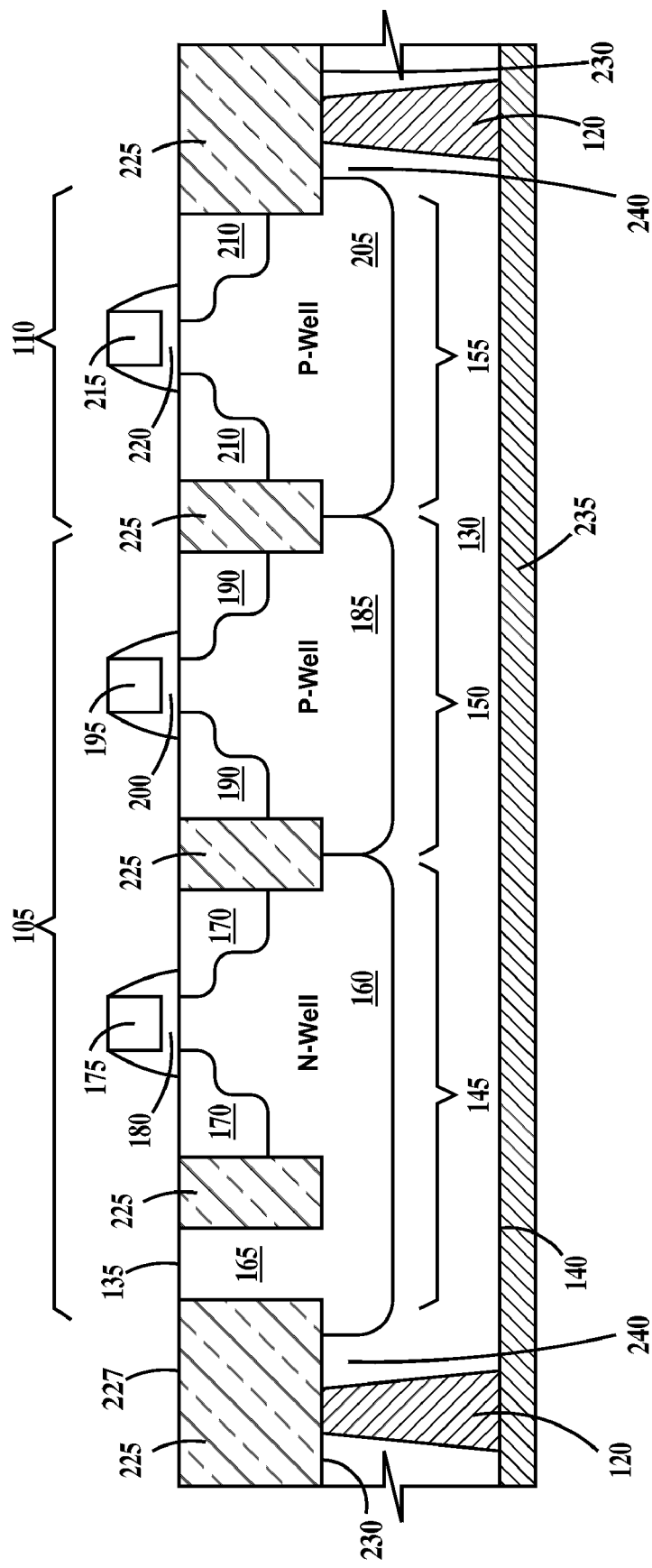
FIG. 3 is a cross-section through line 2/3-2/3 of FIG. 1 illustrating a second embodiment of the present invention.

FIG. 3 is a cross-section through line 2/3-2/3 of FIG. 1 illustrating a second embodiment of the present invention. FIG. 3 differs from FIG. 2 only in through via 120 is not abutting N-Well 160 or P-Well 205. A region 240 of substrate 130 intervenes between through via 120 and N-Well 160 and P-Well 205. Region 240 may form a depletion region during operation of the integrated circuit chip.

In a third embodiment of the present invention, some regions of through vias 120 abut N-Wells and/or P-Wells as illustrated in FIG. 2 and some regions of through vias 120 do not abut N-Wells and/or P-Wells as illustrated in FIG. 3.

Thus, the embodiments of the present invention provide more robust latchup preventive structures and methods for preventing latchup in integrated circuits having I/Os embedded in the core circuit regions of integrated circuit chips.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
   one or more logic circuits positioned in a region of a semiconductor substrate, said substrate having a top surface and a bottom surface, said one or logic circuits comprising first FETs having first well regions in said substrate, said first well regions extending from said top surface of said substrate into said substrate a first distance, said first distance less than a whole distance between said top and bottom surfaces of said substrate;
   an I/O cell and an ESD protection device in said region of said substrate, said I/O cell comprising second FETs having second well regions in said substrate and said ESD protection device comprising third FETs having third well regions in said substrate, said second well regions extending from said top surface of said substrate into said substrate a second distance, said third well regions extending from said top surface of said substrate into said substrate a third distance, said second and third distances less than said whole distance;

shallow trench isolation between said first, second and third FETs, said shallow trench isolation having a top surface coplanar with said top surface of said substrate and a opposite bottom surface in said substrate, said shallow trench isolation extending from said top surface of said substrate into said substrate a fourth distance, said fourth distance less than said whole distance; and an electrically conductive through via extending from said bottom surface of said substrate into said substrate a fifth distance, said fifth distance less than said whole distance, said through via abutting said bottom surface of shallow trench isolation between said ESD protection device and said I/O cell and at least one of said one or more logic circuits and intervening between said ESD protection device and said I/O cell and at least one of said one or more logic circuits.

2. The structure of claim 1, wherein said through via abuts only one or more of said second well regions, only one or more of said third well regions or both one or more of said second well regions and one or more of said third well regions.

3. The structure of claim 2, wherein an interface between said through via and at least one of said second well regions or said third well regions forms a Schottky diode.

4. The structure of claim 1, wherein said through via does not abut any of said second or said third well regions.

5. The structure of claim 1, wherein said through via forms a ring completely around a perimeter of said I/O cell and said ESD protection device.

6. The structure of claim 5, further including one or more gaps in said through via, each gap of said gaps extending from said top surface to said bottom surface of said substrate.

7. The structure of claim 1, wherein said through via does not completely surround a perimeter of said I/O cell and said ESD protection device.

8. The structure of claim 1, further including an electrically conductive layer on said bottom surface of said substrate, said conductive layer in electrical and physical contact with said through via.

9. The structure of claim 1, further including:
said I/O cell and said ESD protection device electrically connected to said I/O cell and at least one of said logic circuits electrically connected to said I/O cell.

10. A method, comprising:
forming one or more logic circuits positioned in a region of a semiconductor substrate, said substrate having a top surface and a bottom surface, said one or logic circuits comprising first FETs having first well regions in said substrate, said first well regions extending from said top surface of said substrate into said substrate a first distance, said first distance less than a whole distance between said top and bottom surfaces of said substrate;

forming an I/O cell and an ESD protection device in said region of said substrate, said I/O cell comprising second FETs having second well regions in said substrate and said ESD protection device comprising third FETs having third well regions in said substrate, said second well regions extending from said top surface of said substrate into said substrate a second distance, said third well regions extending from said top surface of said substrate into said substrate a third distance, said second and third distances less than said whole distance;

forming shallow trench isolation between said first, second and third FETs, said shallow trench isolation having a top surface coplanar with said top surface of said substrate and a opposite bottom surface in said substrate, said shallow trench isolation extending from said top surface of said substrate into said substrate a fourth distance, said fourth distance less than said whole distance; and forming an electrically conductive through via extending from said bottom surface of said substrate into said substrate a fifth distance, said fifth distance less than said whole distance, said through via abutting said bottom surface of shallow trench isolation between said ESD protection device and said I/O cell and at least one of said one or more logic circuits and intervening between said ESD protection device and said I/O cell and at least one of said one or more logic circuits.

11. The method of claim 10, wherein said through via abuts only one or more of said second well regions, only one or more of said third well regions or both one or more of said second well regions and one or more of said third well regions.

12. The method of claim 10, wherein an interface between said through via and at least one of said second well regions or said third well regions forms a Schottky diode.

13. The method of claim 10, wherein said through via does not abut any of said second or said third well regions.

14. The method of claim 10, wherein said through via forms a ring completely around a perimeter of said I/O cell and said ESD protection device.

15. The method of claim 14, further including forming one or more gaps in said through via, each gap of said one or more gaps extending from said top surface to said bottom surface of said substrate.

16. The method of claim 10, wherein said through via does not completely surround a perimeter of said I/O cell and said ESD protection device.

17. The method of claim 10, further including forming an electrically conductive layer on said bottom surface of said substrate, said conductive layer in electrical and physical contact with said through via.

18. The method of claim 10, further including:
said I/O cell and said ESD protection device electrically connected to said I/O cell and at least one of said logic circuits electrically connected to said I/O cell.

* * * * *